United States Patent
MeVay

(10) Patent No.: US 9,759,750 B2
(45) Date of Patent: Sep. 12, 2017

(54) LOW LOSS CURRENT SENSOR AND POWER CONVERTER USING THE SAME

(71) Applicant: Alex C. H. MeVay, Cambridge, MA (US)

(72) Inventor: Alex C. H. MeVay, Cambridge, MA (US)

( * ) Notice: Subject to any disclaimer, the term of this patent is extended or adjusted under 35 U.S.C. 154(b) by 0 days.

(21) Appl. No.: 15/226,468

(22) Filed: Aug. 2, 2016

(65) Prior Publication Data

US 2017/0040894 A1   Feb. 9, 2017

Related U.S. Application Data

(60) Provisional application No. 62/200,194, filed on Aug. 3, 2015.

(51) Int. Cl.
| | |
|---|---|
| *H02M 3/158* | (2006.01) |
| *G01R 19/04* | (2006.01) |
| *H03K 5/1532* | (2006.01) |
| *G01R 15/16* | (2006.01) |
| *H02M 7/217* | (2006.01) |

(52) U.S. Cl.
CPC ............ *G01R 19/04* (2013.01); *G01R 15/16* (2013.01); *H02M 7/217* (2013.01); *H03K 5/1532* (2013.01)

(58) Field of Classification Search
CPC ......... H02M 3/156–3/158; H02M 1/08; H03K 5/1532; G01R 15/16; G01R 19/04
USPC ................. 323/271–279, 282, 284
See application file for complete search history.

(56) References Cited

U.S. PATENT DOCUMENTS

| | | | |
|---|---|---|---|
| 3,072,805 A * | 1/1963 | Rich ........................ | H01G 7/02 310/314 |
| 5,621,628 A | 4/1997 | Miyazaki et al. | |
| 5,675,072 A * | 10/1997 | Yasuda ................. | G01M 15/12 324/378 |
| 5,684,688 A | 11/1997 | Rouaud et al. | |
| 6,002,922 A * | 12/1999 | Schwent ............... | H04W 52/52 455/115.1 |
| 6,429,638 B1 | 8/2002 | Wight et al. | |
| 9,203,300 B2 | 12/2015 | MeVay | |
| 2011/0299636 A1* | 12/2011 | Tsai ........................ | H02J 17/00 375/340 |
| 2012/0193998 A1* | 8/2012 | Tsai ........................ | H02J 7/025 307/104 |

(Continued)

OTHER PUBLICATIONS

Sable et al, "A Zero-Voltage-Switching Bidirectional Battery Charger / Discharger for the NASA EOS Satellite", Applied Power Electronics Conference and Exposition, Conference Proceedings 1992, 0-7803-0485-3/92.

(Continued)

*Primary Examiner* — Yemane Mehari
(74) *Attorney, Agent, or Firm* — Kaplan Breyer Schwarz, LLP; Janine D. Geraigery, Esq.

(57) ABSTRACT

A low-loss current sensor for use with a circuit containing a capacitor to sense a current flowing into a node in the circuit is provided. The current sensor includes a differentiator circuit having an input connected to the circuit capacitor and adapted to generate an output which is proportional to the current flowing through the circuit capacitor. The novel use of a capacitive current divider allows the sensor to sense current with virtually no power dissipation.

20 Claims, 9 Drawing Sheets

(56) References Cited

U.S. PATENT DOCUMENTS

2013/0294118 A1 11/2013 So et al.
2013/0301306 A1 11/2013 Hosotani

OTHER PUBLICATIONS

Authorized Officer: O. Kishkovich, "International Search Report and Written Opinion" dated Nov. 3, 2016 in counterpart PCT/US2016/45264, Publisher: PCT, Published in: RU.

* cited by examiner

LOW LOSS CURRENT SENSOR AND POWER CONVERTER USING THE SAME

CROSS-REFERENCE TO RELATED APPLICATION

This application claims priority under 35 U.S.C. §119 to U.S. provisional patent application Ser. No. 62/200,194 on Aug. 3, 2015, which is incorporated by reference herein in its entirety.

TECHNICAL FIELD

The present invention relates to current sensors for electrical circuits containing a capacitor, and in particular current sensors for use with power converters.

BACKGROUND OF THE INVENTION

In electrical power converters, the measurement of current is commonly achieved by the use of a low-value shunt resistor to generate a small voltage proportional to the current flowing through the shunt resistor. This voltage is then generally amplified for further use or measurement. In a power converter, such a current sensor can be used to measure the current flowing through an inductor, which is used as a magnetic energy storage or transmission element.

However, one problem of using a conventional current sensor is that it wastes power, which may be significant in high-efficiency converters. Therefore, it would be desirable to provide a device and method for more efficiently sensing the current of an electrical circuit.

SUMMARY OF THE DISCLOSURE

According to one aspect of the present invention, a low-loss current sensor for use with a circuit containing a capacitor to sense a current flowing into a node in the circuit is disclosed. The current sensor includes a differentiator circuit having an input connected to the circuit capacitor and adapted to generate an output signal which is proportional to the current flowing into the circuit capacitor. The novel use of a capacitive current divider allows the sensor to sense current with virtually zero dissipated energy.

According to another aspect of the present invention, a power converter (e.g., DC-DC converter) utilizing the above low-loss current sensor is provided. The power converter has two serially connected switches defining a common node therebetween and first and second capacitors connected across respective first and second switches. The capacitors can be separately connected components or are part of the switches such as the small signal output capacitance inherent in the switches. An inductor is connected to the common node and is adapted to drive a load at an output such as a battery.

The current sensor includes a sensing capacitor and resistor. The sensing capacitor has a first terminal connected to the common node and is adapted to generate an output carrying a current which is proportional to the current flowing into the first and second capacitors. The resistor is connected to the second terminal of the sensing capacitor and defines an output of the current sensor, a voltage drop across the resistor being substantially proportional to the current flowing through the sensing capacitor. A controller switches the first and second switches in a complementary manner and controls the turn-on time of at least one of the first and second switches based on readings of the current sensor output.

DETAILED DESCRIPTION OF THE INVENTION

Definitions

Switch: While the specification illustrates a metal-oxide-semiconductor field-effect transistor (MOSFET) as an exemplary switch, a switch can refer to any electrical element capable of conducting or blocking a current, such as a bipolar transistor, IGBT, relay, diode, and the like.

Switching node: An electrical node in the switching system at the junction of two or more switches and an inductive element or other electrical load or source.

Inductor: An explicit inductor, or the intrinsic inductance of another electrical component or circuit.

Transition time: The time during which the switching node is in between the switching potentials, determined by the inductor current, switch current(s), capacitance at the switching node, and the difference between the applicable switching potentials.

Switching potentials: The potentials between which the switching node is switched by the switches.

Controller: a processor, microcontroller or other digital or analog control circuit capable of controlling the switches based on the various control inputs and the desired goals of system operation.

Body diode: The body diode of a MOSFET, or, for other switch types, an implicit or explicit diode or other device or mechanism that allows current to flow through the switch independent of the switch control signal.

In the interest of increasing the efficiency and decreasing the size of power converters and other electrical devices which switch an inductor between different voltages, the technique of Zero Voltage Switching (ZVS), one of the techniques commonly referred to as Soft Switching, has been developed. ZVS is a technique that reduces switching loss, the component of system loss that arises during the time period (called the transition time) while the inductor is switched from one potential to another and during which a switch may have both a substantial voltage across it and a substantial current through it, resulting in substantial power dissipation.

Figure 1:
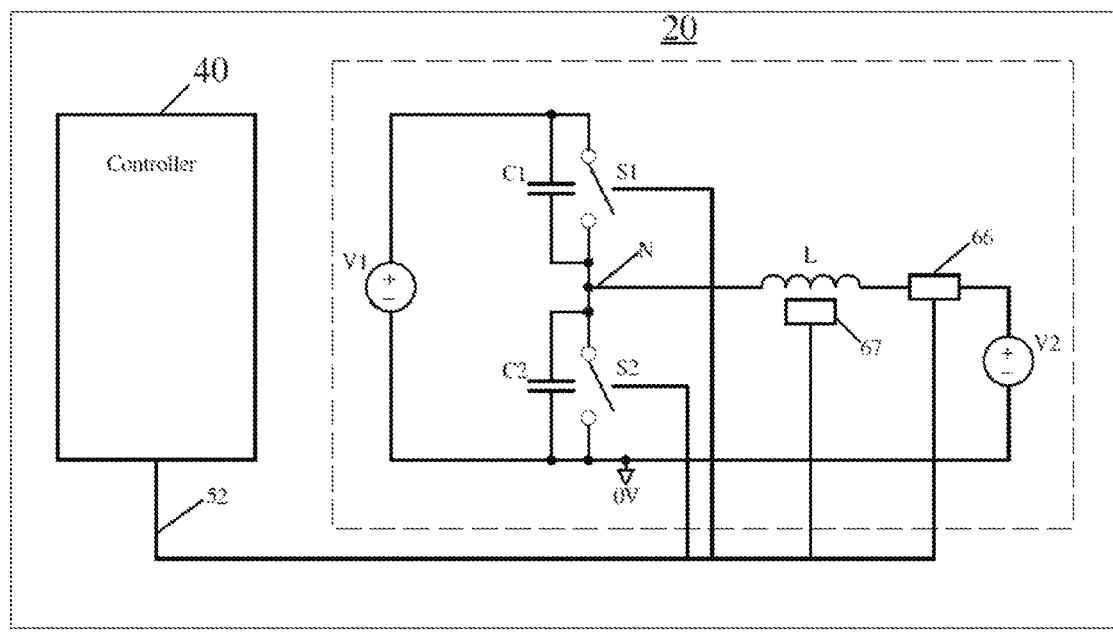
FIG. 1 is a functional block diagram of a zero voltage switching power converter with a controller according to an aspect of the present invention.

FIG. 1 shows a typical switching circuit 20 capable of ZVS operation. C1 and C2 are the implicit or explicit capacitances (either of which may be zero) in parallel with switches S1 and S2. The switches S1 and S2 can be MOSFET switches and are connected in series, with a switching node N defining a common node. The switches S1 and S2 are connected to and can be driven by a controller 40, which typically provides complementary signals such that only one switch is closed at any one time. If S1 and S2 are MOSFETs, then their gates will be connected to the controller 40.

In the embodiment shown in FIG. 1, inductor L is switched between V1 and ground (0V) to transfer power to or from another potential V2. For example, V1 could be a solar panel that generates power and V2 could be a battery to be charged from the solar panel.

Figure 2:
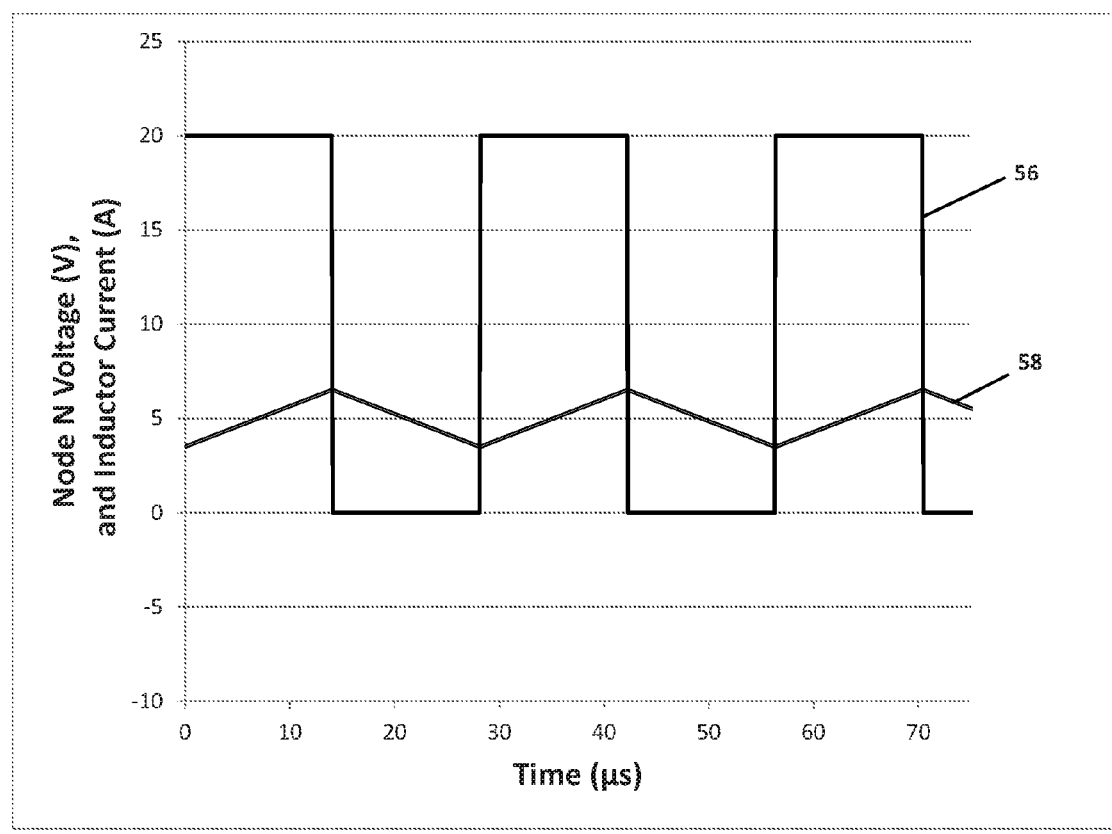
FIG. 2 illustrates switching waveforms for a conventional hard-switched power converter.

In many conventional hard-switched switching circuits, the current through the inductor L is substantially constant (i.e., the AC component of the current is significantly smaller than the DC component). FIG. 2 illustrates switching waveforms for a typical hard-switched power converter. Waveform 56 shows a voltage level at node N while waveform 58 shows current through the inductor L.

Waveform 56 shows that the converter 20 (if it were driven as a hard-switched system) switches the switching node N between 20V and ground (0V) while waveform 58 shows the DC output current at 5 A and AC component at 3 App (−1.5 A to +1.5 A from the DC level), resulting in a minimum inductor current Ilmin of 3.5 A. Since the AC p-p component is less than twice the DC component, the current does not reverse direction, and the minimum current is positive.

By contrast, in a ZVS circuit, the amplitude of the AC component of the current through the inductive component is more than twice the magnitude of the DC component, which means the current reverses direction for at least a portion of each cycle of the switching converter 20.

A second defining feature of a ZVS power converter is the use of capacitance in parallel with one or more of the switching elements. This capacitance may take the form of an added capacitor, or may be intrinsic to the device, such as the output capacitance (Coss) of a MOSFET.

The reversing current and the capacitance across one or more of the switches allows the ZVS switching circuit to take on some of the properties of a resonant L-C circuit. Rather than relying on the switches S1 and S2 to pull the switching node N from one potential to the other, the power converter 20 employs the reversing current in the inductor L. When each switch turns off, the current from the inductor L flows through the capacitance (C1 and C2). This capacitance slows the voltage slew rate of the switching node N, allowing the switch to turn off before the voltage across it has increased appreciably, thereby substantially eliminating switching loss. Similarly, each switch is controlled by the controller 40 to turn on only when the voltage across it (e.g., voltage between drain and source of a MOSFET switch S1 or S2) is approximately zero, again substantially eliminating switching loss.

Figure 3:
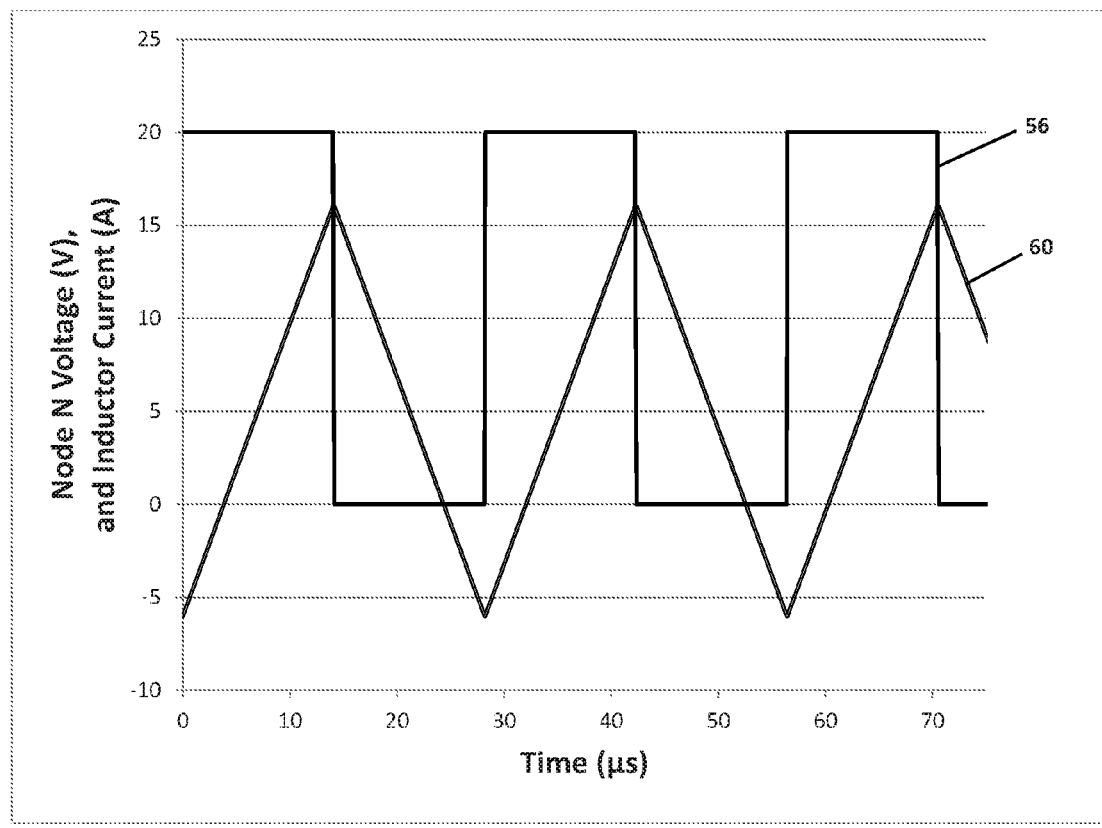
FIG. 3 illustrates switching waveforms for a ZVS power converter according to an aspect of the present invention.

FIG. 3 illustrates switching waveforms for a ZVS power converter 20 according to an aspect of the present invention. The switching potentials, DC current, and frequency are identical to those in FIG. 2. However, the p-p AC current as shown in waveform 60 is much larger at 22 App, resulting in a minimum inductor current Ilmin of −6 A. Because the current through inductor L becomes negative, the current may be used to drive node N from 0V to 20V while the switches are not conducting, and ZVS is thus possible. Conceptually, the converter of the previous example can be changed to the operation of FIG. 3 by reducing the inductance of the inductor L by a factor of 22/3. In the example shown in FIG. 3, the AC current amplitude is much larger than twice the DC component, resulting in unnecessary loss.

Figure 4:
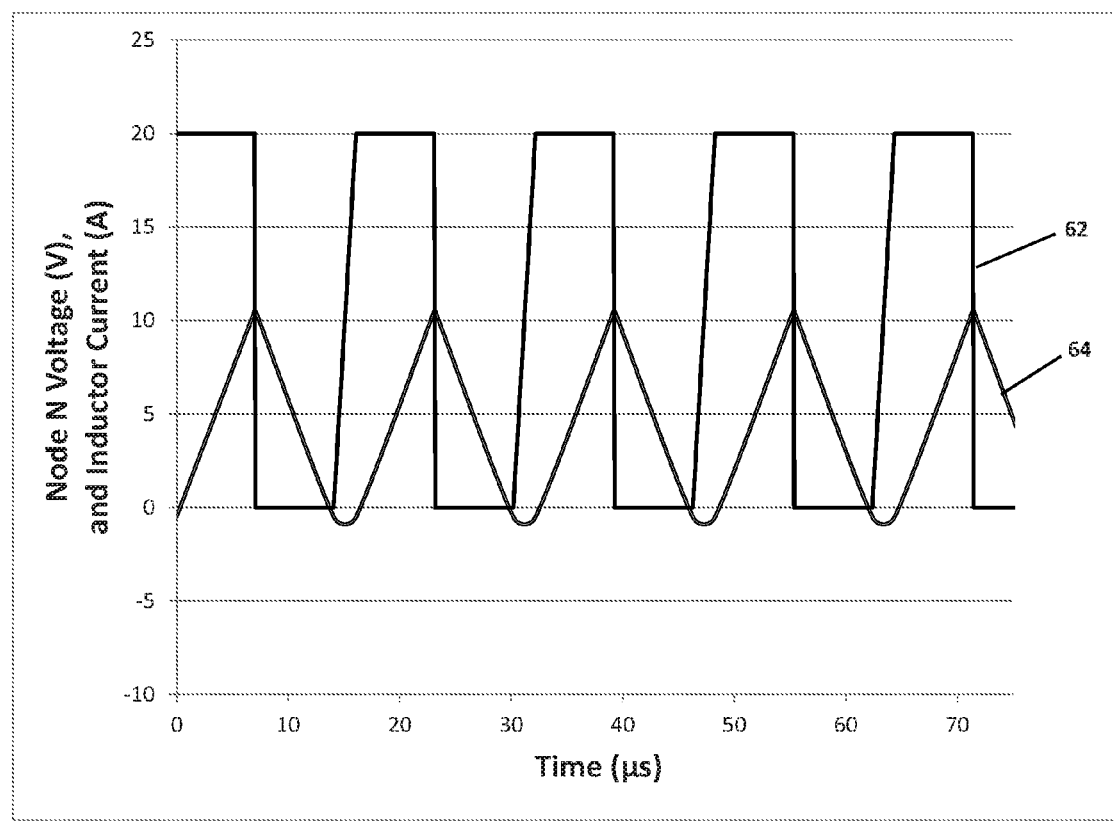
FIG. 4 illustrates switching waveforms for an optimized ZVS power converter according to an aspect of the present invention.

FIG. 4 illustrates switching waveforms for an optimized ZVS power converter 20 according to an aspect of the present invention. Waveform 62 shows the voltage level at node N while waveform 64 shows the current through the inductor L. As can be seen by waveform 62, the power converter 20 is operated at twice the frequency of FIG. 3. Now, the AC component of the inductor current is 11 App, which is just slightly larger than twice the DC component. At this operating point, the minimum inductor current Ilmin becomes only slightly negative. Two qualitative differences are noticeable in the waveforms 62 and 64: (1) the rising edge of the switching node N voltage in waveform 62 becomes visibly sloped due to the relatively small inductor current driving the transition, and (2) in turn the bottom corner of the inductor current waveform 64 becomes noticeably rounded due to the slow voltage transition. This is an optimal operating point for a ZVS converter, as the AC inductor current is just above the threshold necessary for ZVS operation, and the associated AC losses are at approximately the minimum possible.

Conventionally, ZVS converters are operated at a fixed frequency. Given fixed input and output voltages and fixed component values, the AC current flowing through the inductive component is essentially constant, independent of the DC current. An exemplary ZVS converter is disclosed in an article entitled "A Zero-Voltage-Switching Bidirectional Battery Charger/Discharger for the NASA EOS Satellite" by Dan M. Sable, Fred C. Lee and BO H. Cho in pages 614-621, Applied Power Electronics Conference and Exposition, Conference Proceedings 1992, which is incorporated herein by reference.

At light loads, the fixed losses caused by the AC currents will result in poor system efficiency as discussed in the above article. Accordingly, techniques are sought that will preserve ZVS operation while minimizing the AC currents in the ZVS system.

In most practical applications for ZVS systems and power converters in general, the operating potentials and currents are determined by external factors. The input and output potentials will determine the ZVS converter duty cycle to within a narrow range. However, operating frequency remains an independent and free variable.

In one aspect of the present invention, the controller 40 dynamically varies the operating frequency of the switches S1 and S2 on a continuous basis such that the peak-to-peak inductor current Ilpp is regulated to just somewhat more than twice the DC inductor current Ildc in order to keep Ilmin just slightly negative, based on input parameters as discussed below. The AC and DC inductor currents may be measured directly or calculated from other system parameters.

In one embodiment, the DC current through the inductor is measured, and the AC current is calculated according to conventional means. Taking the power converter 20 in FIG. 1 as a representative example, the optimal frequency f can be calculated as follows.

Assume the transition time is negligible, and S1 and S2 are controlled oppositely with respective on times T1 and T2. These variables are related to the frequency f and input and output voltages as follows:

$$f = 1/(T1+T2) \quad (1)$$

$$V2/V1 = T1/(T1+T2) \quad (2)$$

From basic power electronics:

$$Ilpp = T2 * V2/L, \text{ and therefore} \quad (3)$$

$$T2 = Ilpp * L/V2 \quad (4)$$

According to our prior definitions:

$$Ilmin = Ildc - Ilpp/2 \quad (5)$$

To achieve ZVS, Ilmin<0. Ilmin may be set to a fixed target value Ilmintarget, which may typically have a magnitude in the range of 1% to 10% of Ilpp. However, Ilmintarget may depend on the specifics of the converter, and may also be dynamically optimized for variations in Ildc, V1, V2 and/or other system parameters for additional benefit.

After substitutions and eliminations, the following equation (6) for T2 can be obtained:

$$T2 = 2*L*(Ildc - Ilmintarget)/V2 \quad (6)$$

In that case, the following equation, derived from (2), may be used to determine the on time T1 of switch S1 according to the actual or desired input and output voltages V1 and V2:

$$T1 = V2*T2/(V1-V2) \quad (7)$$

Thus, the optimal switch timings T1 and T2 may be calculated by the controller 40 from the following measured, desired, or constant parameters: V1, V2, Ildc, Ilmintarget, and L.

As can be appreciated by persons of ordinary skill in the art, the power converter 20 of FIG. 1 with frequency optimization can provide high efficiency across different load conditions. For example, a typical fixed frequency ZVS converter, as exemplified in the preceding Sable reference, may have peak efficiencies in the high nineties. However, at 10% of full load, electrical efficiency decreases to only about 83%. By contrast, the power converter 20 of FIG. 1 with variable frequency switching may also have peak efficiencies in the high nineties, but at 10% of full load, the efficiency may remain as high as 98%. This represents almost a tenfold reduction in wasted power at the 10% load condition.

Many inductors vary in inductance with current and temperature. In another alternative embodiment of the invention, the control scheme is generalized as follows in which L is a function of Ildc, Ilpp, and a measured inductor temperature t1:

$$T2 = 2*L(Ildc, Ilpp, t1)*(Ildc - Ilmintarget)/V2 \quad (8)$$

The inductor currents Ildc and Ilpp can be calculated as above, or measured in a conventional manner by a current sensor 66 connected in line with the inductor L and connected to the controller 40 while the inductor temperature can be measured with a temperature sensor 67 thermally coupled to the inductor L and electrically connected to the controller (see FIG. 1).

In this embodiment, rather than determining T2 with L as a constant, the controller estimates L based on current and temperature according to a pre-determined relationship.

In the description above, the transition time was taken to be negligible, and switches S1 and S2 were assumed to be controlled oppositely (i.e., as complements of each other). This is a good approximation for the overall control methods described above. However, real switches typically have a non-zero switching time between their on and off states. To avoid both switches being on at the same time with deleterious consequences, practical ZVS and hard switching systems typically include a dead time, during which both switches S1 and S2 are off. These dead times are typically small compared to the overall switching period. In ZVS systems, the dead time allows the inductor current L to drive the switching node N through the switching transition without interference from the switches S1 and S2. Dead times are typically implemented as delays to the turn on of the respective switches and are typically set to constant values with a large enough margin to ensure that the switches don't conduct simultaneously, taking into account differing loads, temperatures, production variations, and the like.

In the case where the switches are MOSFETs (or otherwise include an antiparallel diode), after the switching transition, but before the switch turns on, the MOSFET body diode conducts, resulting in wasted energy. In systems using other switches, inappropriate dead times can result in switches closing with a large voltage across them, also resulting in wasted energy.

Figure 5:
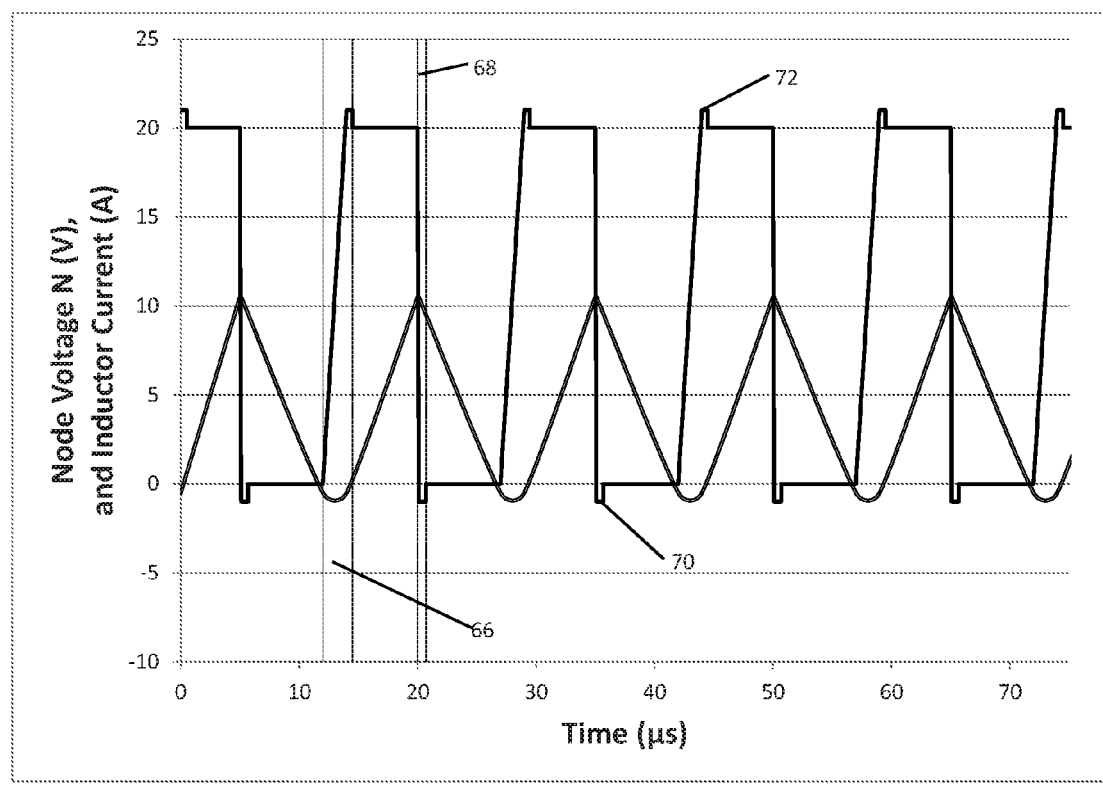
FIG. 5 illustrates dead times and body diode conduction periods for a ZVS power converter according to an aspect of the present invention.

FIG. 5 illustrates typical dead times (rising edge dead time 66 and falling edge dead time 68) and body diode conduction periods (70 and 72) for a ZVS power converter according to an aspect of the present invention.

In one embodiment, the present invention includes a control scheme that dynamically optimizes dead times to substantially eliminate dead time error. Accordingly, body-diode conduction or other similar losses are substantially eliminated.

In one embodiment, dead times are calculated based on inductor currents during the respective switching transitions, which may in turn be calculated based on measured DC current, switch timings, and input and output voltages, according to conventional techniques, one of which is illustrated below.

The definition of a capacitor gives us:

$$I = C*dV/dt \quad (9)$$

Integrating and rearranging, the following formula can be obtained:

$$\Delta t = C*\Delta V/I \quad (10)$$

$\Delta t$ is the time the switching node N takes to move from ground to V1 or vice versa. Thus, for an ideal dead time DT to minimize body diode conduction, $\Delta V$ is simply V1, I is the average inductor current during the transition, and C is the total capacitance at node N, which in the case of the power converter 20 equals C1+C2 and any parasitic capacitances. As a first approximation, it can be assumed that the inductor current doesn't change during the dead times, because they are comparatively brief. In this example, while voltage at node N is rising, the inductor current is at a minimum, Ilmin, and thus, ignoring signs, the transition time and ideal dead time will be:

$$DT1 = C*V1/Ilmin \quad (11)$$

While node N is falling, the inductor current is the DC value plus half the peak to peak value, and thus, neglecting signs, the ideal dead time will be:

$$DT2 = C*V1/(Ildc + Ilpp/2) \quad (12)$$

Once the ideal dead time has been determined, the controller 40 can output appropriate signals to control the gates of the switches S1 and S2 to the determined dead time periods. The parasitic components contributing to C may depend on V1 or other system parameters, and the controller 40 may estimate these changes based on a pre-determined relationship for additional accuracy.

Dead times calculated in this manner can enable performance increases relative to the conventional technique of fixed dead times. However, the technique is still prone to production variations and other unknowns, meaning a safety margin, resulting in body diode conduction and associated loss, will still need to be added in practical converters. For example, a safety margin of 10-100% of the determined optimal dead time can be added in order to allow for measurement or estimation errors in the parameters used to calculate the optimum dead times.

One method to change the dead time in both digital and analog systems is to delay the turn on of each switch S1 and S2 by the duration of the desired dead time for that transition. In digital systems, these delay values may typically be set directly according to the previous calculations, with an added margin if desired. In this manner, T1 and T2 are substantially unchanged, so there will be no interference with the feedback loops controlling them, and thus the dead times may be optimized independently to maximize converter efficiency.

In power converters using MOSFET switches, the voltage across the switch when it is turned on will be typically smaller than 0.7V. When the switch is off and the body diode is conducting, the voltage on the switch will generally be 0.7-1.5V. Therefore, it is possible to determine if the body diode is conducting simply by comparing the voltage across the MOSFET to a threshold, which may be dynamically varied to suit operating conditions such as current, temperature, and the like. For the case of an N-channel MOSFET, for instance, the body diode is conducting if Vds<−0.5V.

In another embodiment, the invention includes a controller 40 which determines dead times via direct measurement of body-diode conduction, resulting in optimal dead-time values at all operating points and over production variations, resulting in robustly efficient operation.

Figure 6:
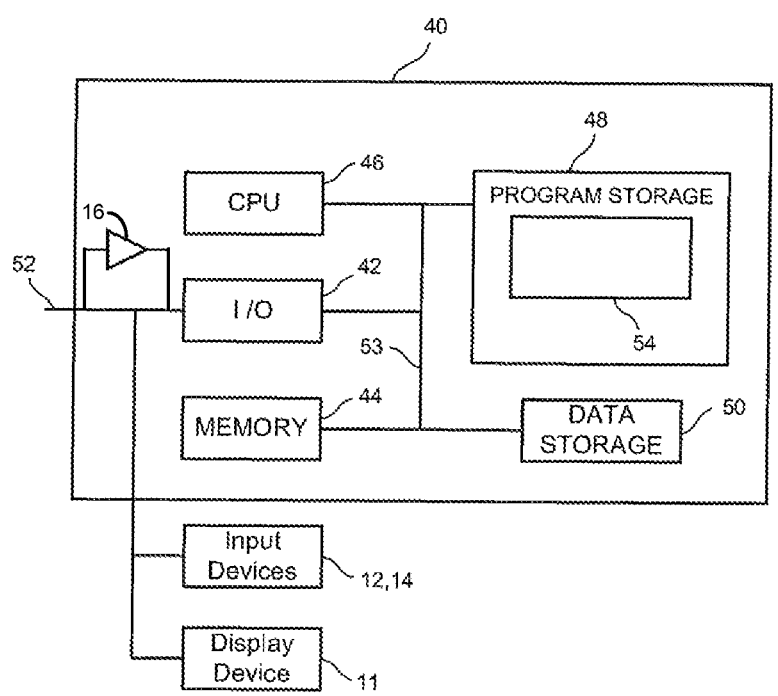
FIG. 6 is a functional block diagram of a controller for controlling a power converter according to an aspect of the present invention.

FIG. 6 is a functional diagram of a controller 40 for controlling a power converter 20 according to an aspect of the present invention.

The controller 40 of the present invention is connected to various nodes of the power converter 20 through communication links 52 which are connected to an I/O interface 42, which receives information from and sends information over the communication links. Inputs which are analog in nature may pass through an A/D converter 16 prior to being fed into the I/O interface 42.

The controller 40 includes memory storage 44 such as RAM (random access memory), processor (CPU) 46, program storage 48 such as Flash, FPGA, ROM or EEPROM, and data storage 50 such as a hard disk, all commonly connected to each other through a bus 53. The program storage 48 stores, among others, a power control module 54 containing software to be executed by the processor 46. The power control module 54 receives various signals from the power converter 20 and controls the conversion ratio V2/V1 of the converter based on those signals as will be discussed later herein.

The power control module 54 may include a user interface module that interacts with a user through the display device 11 and input devices such as keyboard 12 and pointing device 14 such as arrow keys, mouse or touchpad. The user interface module assists the user in programming the module 54 for desired performance of the power converter 20. Any of the software program modules in the program storage 48 and data from the data storage 50 can be transferred to the memory 44 as needed and is executed by the CPU 46.

One exemplary controller 40 may be the AVR series of microcontrollers from Atmel Corporation of San Jose, Calif. However, any suitable digital signal processor, processor or microcontroller can be used.

Figure 7:
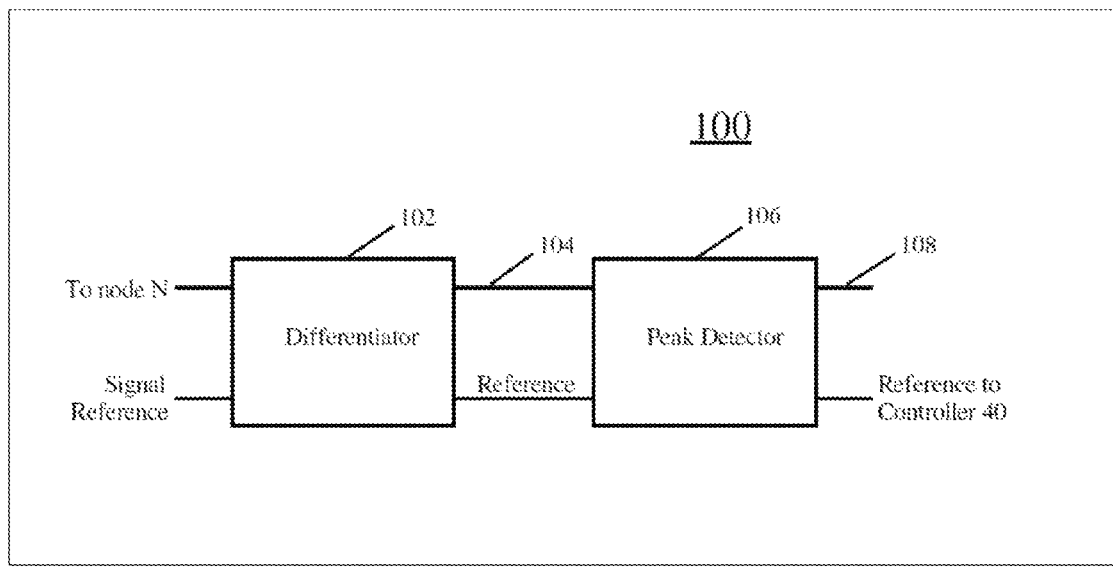
FIG. 7 is a functional block diagram of a low loss current sensor according to an aspect of the present invention.

According to an aspect of the present invention, a current sensor 100 which uses virtually no energy/power is disclosed. As shown in FIG. 7, a differentiator circuit 102 has an input connected to node N (see FIG. 1). An output 104 of the differentiator 102 creates a signal D which is proportional to the rate of change of voltage at node N. Because the impedance at node N is capacitive during the converter dead times, the signal at node N is proportional to the current flowing into node N during the dead times. Under the control of the controller 40, this signal D at output 104 is sampled during the dead times for a measure of inductor current, or fed to a peak detector 106 so as to measure the maximums or minimums automatically. The sampled signal at node 104 or peak-detected output signal at output 108 can then be used by the controller 40 of the power converter 20.

Figure 8:
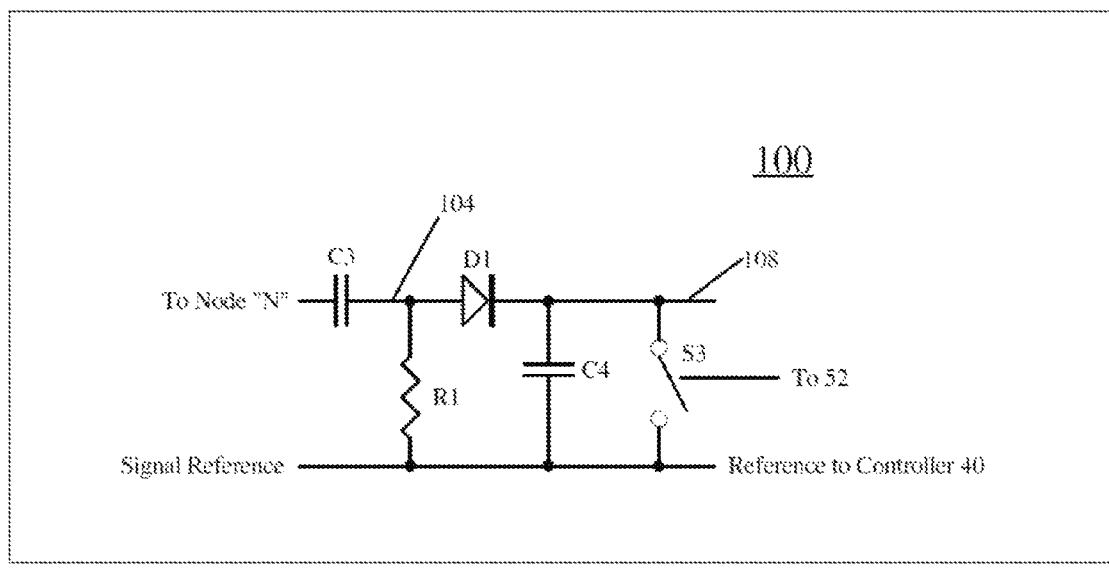
FIG. 8 illustrates an exemplary low loss current sensor according to an aspect of the present invention.

FIG. 8 illustrates an exemplary low loss current sensor according to an aspect of the present invention. The differentiator 102 has been approximated by a high-pass filter composed of sensing capacitor C3 (typically 1 pF-1 nF) and resistor R1 (typically 100Ω-10KΩ), and the peak detector 106 has been implemented with diode D1 whose input is connected to the output 104, and detection capacitor C4 (typically 100 pF-1 nF) and switch S3 (which may be a MOSFET) connected in parallel to each other. The switch S3 is under the control of, or may be an integral part of the controller 40.

In operation, prior to sensing a new current value, S3 is closed to discharge detection capacitor C4, then opened by the controller 40. If output 108 feeds into a microcontroller, it may be possible for the microcontroller to hold the output node 108 low with an internal switch to discharge detection capacitor C4, thus eliminating the need for a separate switch S3.

During each converter dead time, the full current of inductor L flows into node N, with a total capacitance of typically 1-1000 nF, which includes the output capacitance Coss of the power switches S1 and S2 and the explicit capacitors C1 and C2 (see FIG. 1). Some small fraction of the inductor L current also flows through sensing capacitor C3, according to the ratio of C3 to the total capacitance at node N, which may typically be in the range of 1/100-1/10,000.

This current is converted to a voltage by resistor R1, rectified by diode D1, and over several cycles, charges up detection capacitor C4 to a voltage equal to the peak value of output 104 less the voltage drop of diode D1 to produce a signal at output 108, which represents a measure of current flowing into the converter capacitors C1 and C2 through the inductor L during one of the dead times. The dead times typically occur at times of maximum and minimum inductor current. Thus, depending on the orientation of diode D1, the invention may be configured to produce a measure of either the maximum or minimum (Ilmin) inductor current over the switching cycle.

As can be appreciated by persons of ordinary skill in the art, a typical method of measuring current involves passing the entire current through a resistor, which can be very lossy. By contrast, in the current sensor 100 of the present invention, only about 1/1000th of the current is being passed through a resistor for only perhaps 1/100th of the time (the converter dead times). Therefore, the current sensor of FIG.

8 allows inductor L current to be sensed with extremely low power dissipation, e.g., on the order of ¹⁄₁₀,₀₀₀th-¹⁄₁₀₀,₀₀₀th of the conventional technique.

Although the differentiator circuit 102 has been shown with a high pass filter comprising capacitor C3 and resistor R1, other types of circuits can be used such as a resistor R1 connected in series with an inductor between the switching node N and reference with the node common to the resistor and inductor being its output. Conventional active differentiators and peak detectors may also be employed.

Figure 9:
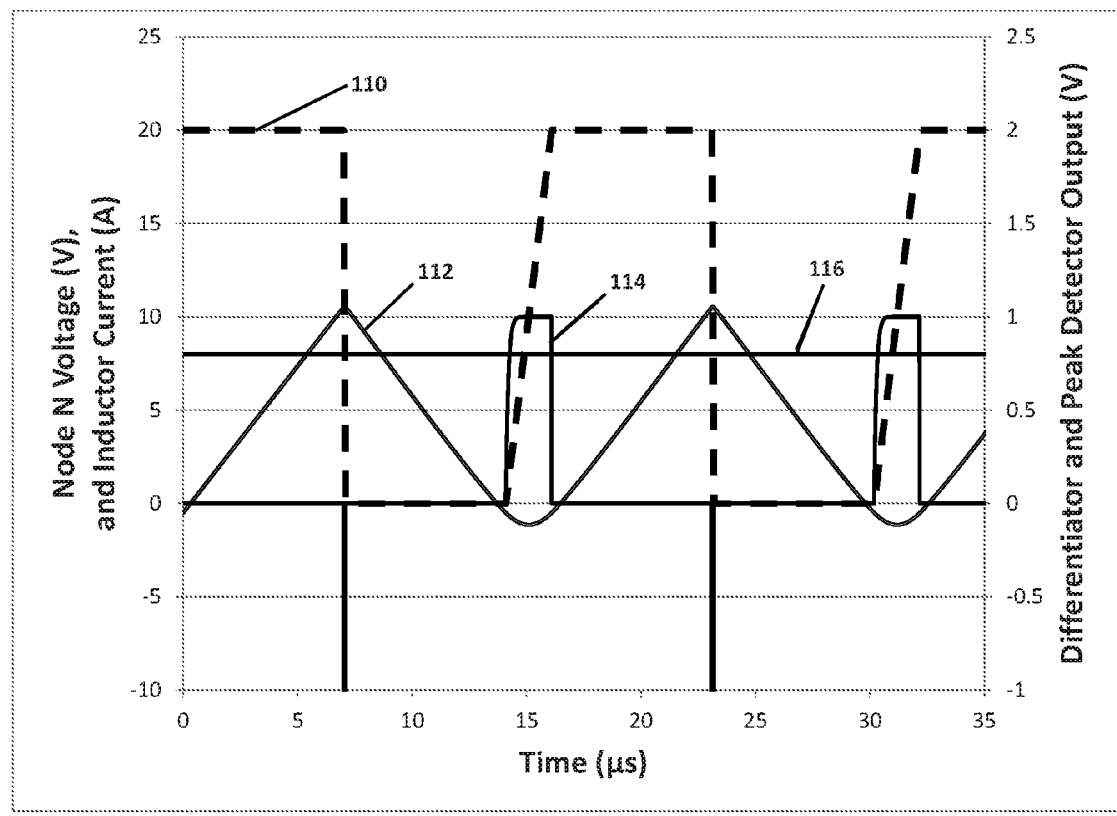
FIG. 9 illustrates representative waveforms of various nodes in the current sensor of FIG. 8.

FIG. 9 illustrates representative waveforms of various nodes in the current sensor of FIG. 8. As in FIG. 1, as the switch S1 turns on and off, the voltage 110 at node N alternates between 20 V and 0V. The current 112 flowing through the inductor L rises to approximately 11 A when the switch S1 turns on and falls to approximately 0 A when the switch S1 turns off and S2 turns on. During the dead time when both switches S1 and S2 are off, the current through the inductor L falls below 0V to approximately −1.5 A before rising to 0 A.

During the dead time, the output 104, illustrated in waveform 114, rises to approximately 1V while the output 108, illustrated in waveform 116, rises to approximately 0.8V due to the voltage drop across diode D1. Although FIG. 9 shows a relatively horizontal line 116 for output 108, as it would be in steady state, the voltage does rise gradually through the initial dead times after the switch S3 discharges the detection capacitor C4.

Although the current sensor 100 can be configured to calculate either maximum or minimum current (negative or positive peak current) into a capacitive node by changing, for example, the orientation of the diode, in the preferred embodiment for use in the ZVS converter described herein the invention provides a measure of the minimum inductor current Ilmin. Ilmin can be calculated from the voltage V108 at output 108 of the current sensor 100 using the following equation, where M is a constant (negative in this example) dependent primarily on the circuit component values, and Vk is a constant voltage substantially equal to the diode drop of diode D1:

$$Ilmin=M*(V108+Vk) \quad (13)$$

Direct measurement of Ilmin allows the controller 40 to regulate T1 and T2 according to equations (6) and (7) so that Ilmin approaches the optimal value Ilmintarget.

Using Ilmin and the other known or calculated operating parameters, the controller 40 can calculate the actual DC current Ildc, which can be used by the controller 40 to control the power converter. Based on equations (4) and (5), the following equation is derived.

$$Ildc=Ilmin+T2*V2/L/2, \text{ or:} \quad (14)$$

$$Ildc=M*(V108+Vk)+T2*V2/L/2 \quad (15)$$

Assuming output V2 stays relatively constant, DC output currents Ildc at different input voltages V1 may be compared without math simply by adjusting the high switch S1 on time T1 only. Changing T1 does not directly affect any of the parameters in equation (15), so a change up or down of V108 corresponds directly to a change down or up of Ildc.

According to another aspect of the invention, the controller 40 uses the sensed current at output 108 to control the power converter 20 for optimal charging of a battery at V2 from a power source at V1. Since the output 108 is an analog signal, it is routed to the A/D converter 16 of the controller to convert it to a digital signal. Often, the optimal input voltage at V1 for charging a battery at V2 changes according to the power being generated by, or other characteristics of, the power source at V1. For example, a power source such as a solar panel generates maximum power at a particular voltage which depends on various factors such as insolation, shading, dirt on the panel, temperature, age of the panel, and the like. That optimal voltage at any given time needs to be found for maximum transfer of power to the load at V2.

One method for finding the optimal voltage V1 is known as hill climbing or Perturb and Observe (P & O). To implement this method, the controller 40 can vary the high switch S1 on-time (T1) by a certain increment in one direction, e.g., gradually increasing T1 by a predetermined increment thereby gradually decreasing the voltage V1. At the same time, the controller 40 monitors the output 108 to see if Ildc increases according to equation (15). If so, the controller 40 continues to increase T1 to reduce the voltage at V1 further to continue to "climb the hill" and increase Ildc. Assuming the battery voltage V2 is relatively constant, an increase in Ildc corresponds to an increase in power delivery from the solar panel to the battery.

When the controller 40 determines via monitoring output 108 that Ildc has decreased, it indicates that the power converter 20 went past the optimal voltage V1 and started to go "downhill" in power delivery. In that case, the controller 40 changes direction and starts to decrease the T1 by a second predetermined increment thereby gradually increasing the voltage V1. The second predetermined increment can be a smaller increment for fine tuning the proper T1. The decrease in T1 continues until power output decreases, at which point the controller will begin increasing T1, repeating the cycle. As can be seen, hill climbing is an iterative process and the controller 40 is continuously adjusting T1 to adjust for the changing power generation condition of the power source.

During this procedure, it may be necessary for the controller 40 to adjust T2 (and T1 proportionally) to maintain Ilmin near Ilmintarget and thus ensure optimal electrical efficiency of the ZVS converter.

It is significant to note that since the change in voltage output at 108 is proportional to the change in Ildc, the controller can directly compare the present voltage value (sampled values) at 108 to a previous voltage value at 108 to determine whether the current Ildc went up or down without any further calculation. In other words, adjustment of T1 and T2 for both optimal converter frequency and to implement a hill climbing algorithm may be accomplished without the need to calculate Ildc according to equation (15).

In one embodiment, the controller 40 samples the current from the current sensor 100 whenever the readings are needed. In another embodiment, the controller 40 may sample the current from the current sensor 100 at only the dead times, either 66, 68 (see FIG. 5) or both.

According to another aspect of the invention, the power converter 20 can be operated in a reverse direction to supply power to V1 from V2 simply by changing the direction of diode D1 in the peak detector 106 and adjusting the controller algorithm appropriately. Two current sensors may be used in order to produce a bidirectional power converter.

The foregoing specific embodiments represent just some of the ways of practicing the present invention. Many other embodiments are possible within the spirit of the invention. Accordingly, the scope of the invention is not limited to the foregoing specification, but instead is given by the appended claims along with their full range of equivalents.

What is claimed is:

1. A low-loss current sensor for use with a circuit containing a capacitor to sense a current flowing into a node in the circuit, comprising:
    a differentiator circuit having an input connected to the circuit capacitor and adapted to generate an output which is proportional to the current flowing through the circuit capacitor.

2. The low-loss current sensor of claim 1, wherein the differentiator circuit includes a sensing capacitor having a first terminal connected to the circuit capacitor and a second terminal carrying a current which is proportional to the current flowing through the circuit capacitor.

3. The low-loss current sensor of claim 1, wherein the differentiator circuit includes:
    a sensing capacitor having a first terminal connected to the circuit capacitor and a second terminal, the sensing capacitor carrying a current which is substantially proportional to the current flowing through the circuit capacitor;
    a resistor connected to the second terminal of the sensing capacitor, a voltage drop across the resistor being proportional to the current flowing through the sensing capacitor.

4. The low-loss current sensor of claim 1, further comprising a peak detector coupled to the differentiator output to detect a peak value of the current flowing through the circuit capacitor.

5. The low-loss current sensor of claim 4, wherein the peak detector includes:
    a diode having an input connected to the differentiator output; and
    a detection capacitor connected between the diode and ground, the voltage across the detection capacitor representing a peak detected current value.

6. The low-loss current sensor of claim 4, wherein the peak detector includes a switch connected to the detection capacitor for discharging the detection capacitor prior to sensing a new current flowing through the differentiator circuit.

7. The low-loss current sensor of claim 4, wherein the peak detector includes a switch connected across the detection capacitor, further comprising a controller adapted to sample a voltage across the detection capacitor and to close the switch to discharge the detection capacitor prior to sampling the voltage.

8. The low-loss current sensor of claim 1, further comprising a controller having an input connected to the differentiator circuit output and adapted to generate a digital value corresponding to the current flowing through the circuit capacitor.

9. The low-loss current sensor of claim 8, wherein:
    the circuit having the capacitor includes a zero-voltage-switching power converter having first and second switches connected in series and defining a common node therebetween, the common node being connected to the input of the differentiator circuit;
    the controller is adapted to determine an optimal energy transfer point by varying the turn-on time of at least one of the first and second switches and comparing corresponding sensed current values of the differentiator output.

10. The low-loss current sensor of claim 1, wherein the capacitance of the sensing capacitor is at most one percent of the capacitance of the circuit capacitor.

11. A power converter comprising:
    first and second switches connected in series and defining a common node therebetween;
    at least one circuit capacitor connected to one of the first and second switches;
    an inductor connected to the common node and adapted to provide power to a load or receive power from an input;
    a current sensor including:
        a sensing capacitor having a first terminal connected to the common node and adapted to generate an output carrying a current which is proportional to the current flowing through the first and second capacitors;
        a resistor connected to the second terminal of the sensing capacitor and defining an output of the current sensor, a voltage drop across the resistor being substantially proportional to the current flowing through the sensing capacitor;
    a controller adapted to switch the first and second switches in a complementary manner and control the on time of at least one of the first and second switches based on readings of the current sensor output.

12. The power converter of claim 11, wherein the controller is adapted to determine an optimal energy transfer point by varying the turn-on time of at least one of the first and second switches and comparing corresponding values of the current sensor output.

13. The power converter of claim 11, further comprising a peak detector coupled to the resistor to detect a negative or positive peak value of the current flowing through the at least one circuit capacitor.

14. The power converter of claim 13, wherein the peak detector includes:
    a diode having an input connected to the resistor; and
    a detection capacitor connected between the diode and a signal reference, the voltage across the detection capacitor representing a peak detected current value.

15. The power converter of claim 14, wherein the peak detector includes a switch connected to the detection capacitor for discharging the detection capacitor prior to sensing a new current flowing through the sensing capacitor.

16. The power converter of claim 11, wherein the capacitance of the sensing capacitor is at most one percent of the capacitance of the at least one circuit capacitor.

17. The power converter of claim 11, wherein the controller is adapted to dynamically and continuously vary a switching frequency of the first and second switches based on readings of the current sensor output.

18. The power converter of claim 11, wherein the controller is adapted to sample the current sensor output only during dead times of the first and second switches.

19. The power converter of claim 11, wherein the controller converts the current sensor output to digital values and samples the sampled digital values.

20. The power converter of claim 14, wherein the controller varies the turn-on time of at least one of the first and second switches based on a direct comparison of a present value of the voltage across the detection capacitor and a previous value of the voltage across the detection capacitor without further calculation.

* * * * *